(12) United States Patent
Gordon

(10) Patent No.: US 6,236,565 B1
(45) Date of Patent: May 22, 2001

(54) CHIP STACK WITH ACTIVE COOLING SYSTEM

(76) Inventor: Mark G. Gordon, 615 Orchid, Corona Del Mar, CA (US) 92625

(*) Notice: Subject to any disclaimer, the term of this patent is extended or adjusted under 35 U.S.C. 154(b) by 0 days.

(21) Appl. No.: 09/594,363

(22) Filed: Jun. 15, 2000

(51) Int. Cl.$^7$ .................................................. H05K 7/20
(52) U.S. Cl. .......................... 361/695; 361/704; 361/749; 361/719; 174/16.1; 174/252; 174/254
(58) Field of Search .................................. 361/704, 690, 361/695, 707, 710, 715, 719–721, 749; 165/80.2, 80.3, 135; 174/16.3, 252, 254, 16.1

(56) References Cited

U.S. PATENT DOCUMENTS

| | | | |
|---|---|---|---|
| 4,833,568 | * | 5/1989 | Berhold ................................. 361/690 |
| 5,241,454 | * | 8/1993 | Ameen et al. ........................ 361/744 |
| 5,247,423 | * | 9/1993 | Lin et al. .............................. 361/719 |
| 5,276,418 | * | 1/1994 | Klosowiak et al. .................. 335/202 |
| 5,386,341 | * | 1/1995 | Olson et al. .......................... 361/749 |
| 5,430,614 | * | 7/1995 | Difrancesco ......................... 361/785 |
| 5,926,369 | * | 7/1999 | Ingraham et al. .................... 361/699 |
| 5,943,213 | * | 8/1999 | Sasov .................................... 361/705 |
| 5,995,370 | * | 11/1999 | Nakamori ............................. 361/704 |
| 6,061,245 | * | 5/2000 | Ingraham et al. .................... 361/749 |
| 6,111,761 | * | 8/2000 | Peana et al. .......................... 361/818 |
| 6,154,367 | * | 11/2000 | Pavlovic ............................... 361/707 |

FOREIGN PATENT DOCUMENTS

406021681A * 1/1994 (JP) ..................................... 174/255

OTHER PUBLICATIONS

TECA Corporation, ThermoElectric Cooling America Corporation, Theory of Operation; Product Selection Chart with graphics and Specifications, World Wide Web—Jan. 1, 2000 (7 pages).

Advanced Thermoelectric Products, How and Why TE Modules Work; Fundamental Thermoelectrics; NORD TE Module Specifications, NORD TE Module Prices, World Wide Web—Jan. 26, 2000 (11 pages).

* cited by examiner

Primary Examiner—Leo P. Picard
Assistant Examiner—Boris L. Chervinsky
(74) Attorney, Agent, or Firm—Stetina Brunda Garred & Brucker

(57) ABSTRACT

A stackable integrated circuit chip package comprising a carrier and a flex circuit. The flex circuit itself comprises a flexible substrate having opposed top and bottom surfaces, and a conductive pattern which is disposed on the substrate. The substrate is wrapped about and attached to at least a portion of the carrier such that the conductive pattern defines first and second portions. The chip package further comprises an integrated circuit chip which is electrically connected to the first portion of the conductive pattern such that an air path is defined between the integrated circuit chip and the carrier. The chip package is configured such that the second portion of the conductive pattern and the integrated circuit chip are each electrically connectable to another stackable integrated circuit chip package. A chip stack assembled using chip packages of the present invention is preferably used in conjunction with an active cooling system operative to circulate cooling air through the air path defined by each chip package.

22 Claims, 2 Drawing Sheets

CHIP STACK WITH ACTIVE COOLING SYSTEM

CROSS-REFERENCE TO RELATED APPLICATIONS (Not Applicable)

STATEMENT RE: FEDERALLY SPONSORED RESEARCH/DEVELOPMENT (Not Applicable)

BACKGROUND OF THE INVENTION

The present invention relates generally to chip stacks, and more particularly to a stackable integrated circuit chip package including a flex circuit and a carrier which allows multiple chip packages to be quickly, easily and inexpensively mechanically registered and interconnected or assembled into a chip stack having a minimal profile.

Multiple techniques are currently employed in the prior art to increase memory capacity on a printed circuit board. Such techniques include the use of larger memory chips, if available, and increasing the size of the circuit board for purposes of allowing the same to accommodate more memory devices or chips. In another technique, vertical plug-in boards are used to increase the height of the circuit board to allow the same to accommodate additional memory devices or chips.

Perhaps one of the most commonly used techniques to increase memory capacity is the stacking of memory devices into a vertical chip stack, sometimes referred to as 3D packaging or Z-Stacking. In the Z-Stacking process, from two (2) to as many as eight (8) memory devices or other integrated circuit (IC) chips are interconnected in a single component (i.e., chip stack) which is mountable to the "footprint" typically used for a single package device such as a packaged chip. The Z-Stacking process has been found to be volumetrically efficient, with packaged chips in TSOP (thin small outline package) or LCC (leadless chip carrier) form generally being considered to be the easiest to use in relation thereto. Though bare dies or chips may also be used in the Z-Stacking process, such use tends to make the stacking process more complex and not well suited to automation.

In the Z-Stacking process, the IC chips or packaged chips must, in addition to being formed into a stack, be electrically interconnected to each other in a desired manner. There is known in the prior art various different arrangements and techniques for electrically interconnecting the IC chips or packaged chips within a stack. Examples of such arrangements and techniques are disclosed in Applicant's U.S. Pat. No. 4,956,694 entitled INTEGRATED CIRCUIT CHIP STACKING issued Sep. 11, 1990, U.S. Pat. No. 5,612,570 entitled CHIP STACK AND METHOD OF MAKING SAME issued Mar. 18, 1997, and U.S. Pat. No. 5,869,353 entitled MODULAR PANEL STACKING PROCESS issued Feb. 9, 1999.

The various arrangements and techniques described in these issued patents and other currently pending patent applications of Applicant have been found to provide chip stacks which are relatively easy and inexpensive to manufacture, and are well suited for use in a multitude of differing applications. The present invention provides yet a further alternative arrangement and technique for forming a chip stack which involves the use of stackable integrated circuit chip packages including flex circuits and carriers. The inclusion of the carriers in the chip packages of the present invention provides numerous advantages in the assembly of the chip stack, including significantly greater ease in achieving and maintaining the registry or alignment between the chip packages within the stack. Additionally, the use of the carriers significantly simplifies the interconnection or assembly of the chip packages into a chip stack. The carriers are further specifically adapted to maximize the flow of cooling air about the integrated circuit chips of the chip packages, with the chip stack constructed in accordance with the present invention preferably being used in combination with an active cooling system.

BRIEF SUMMARY OF THE INVENTION

In accordance with the present invention, there is provided a stackable integrated circuit chip package which comprises a carrier and a flex circuit. The flex circuit itself comprises a flexible substrate having opposed top and bottom surfaces. Disposed on the substrate, and in particular the top surface thereof, is a conductive pattern. The substrate is wrapped about and attached to at least a portion of the carrier such that the conductive pattern defines first and second portions. Also included in the chip package is an integrated circuit chip which is electrically connected to the first portion of the conductive pattern such that an air path is defined between the integrated circuit chip and the carrier. The chip package is configured such that the second portion of the conductive pattern and the integrated circuit chip are each electrically connectable to another stackable integrated circuit chip package.

In the chip package of the present invention, the carrier is sized and configured to be releaseably attachable to the carrier of at least one other identically configured stackable integrated circuit chip package in a manner wherein the chip packages, when attached to each other, are maintained in registry along first and second axes which are generally co-planar and extend in generally perpendicular relation to each other. The carrier of the chip package has a generally rectangular top section which defines inner and outer surfaces and opposed pairs of longitudinal and lateral sides. In addition to the top section, the carrier includes a pair of identically configured side rail sections which extend along respective ones of the longitudinal sides of the top section and each define an outer surface and a distal edge. In the chip package, the bottom surface of the substrate is attached to portions of the outer surfaces of the top section and the side rail sections. Additionally, the substrate is wrapped about and attached to the carrier such that the first portion of the conductive pattern extends over portions of the outer surfaces of the side rail sections, with the second portion of the conductive pattern extending over a portion of the outer surface of the top section in spaced, generally parallel relation to the first portion. The substrate itself preferably has a generally rectangular configuration defining opposed pairs of longitudinal and lateral peripheral edge segments. The conductive pattern extends along the top surface of the substrate to the lateral peripheral edge segments thereof. The substrate is preferably sized relative to the carrier such that when the substrate is wrapped about portions of the outer surfaces of the top section and side rail sections, the lateral peripheral edge segments of the substrate extend to approximately respective ones of the distal edges of the side rail sections.

The integrated circuit chip of the chip package of the present invention is preferably a TSOP (thin small outline package) device comprising a body having opposed, generally planar top and bottom surfaces, an opposed pair of longitudinal sides, and an opposed pair of lateral sides. In addition to the body, the integrated circuit chip includes a plurality of conductive leads which protrude or extend from each of the longitudinal sides of the body. The conductive leads of the integrated circuit chip are electrically connected to the first portion of the conductive pattern. The chip package may further comprise a Z-axis pad which is electrically connected to the conductive leads for facilitating the electrical connection of the chip package to the second portion of the conductive pattern of another stackable integrated circuit chip package. As an alternative to the Z-axis pad, the chip package may comprise a support member which is electrically connected to the conductive leads for facilitating the electrical connection of the chip package to a mother board. The chip package including the support member as an alternative to the Z-axis pad provides a base chip package upon which other chip packages may be stacked to form a chip stack in accordance with the present invention. The conductive leads are also preferably sized and configured such that a top air path is defined between the top surface of the body and the inner surface of the top section, and a bottom air path is defined between the bottom surface of the body and the Z-axis pad or support member.

In the chip package of the present invention, the substrate is preferably attached to the carrier through the use of an acrylic film adhesive. The substrate itself is preferably fabricated from a polyamide having a thickness in the range of from about 1 mil to about 8 mils. The carrier is preferably fabricated from a sheet metal material to provide heat dissipation properties.

To facilitate the releaseable attachment of the carrier of the chip package to the carrier of another identically configured stackable integrated circuit chip package, the carrier is preferably formed to include two attachment tabs which are integrally connected to the top section of the carrier and protrude upwardly from the outer surface thereof. The attachment tabs are disposed along one of the lateral sides of the top section in spaced relation to each other. In addition to the attachment tabs, the carrier preferably includes two alignment tabs which are also integrally connected to the top section and protrude upwardly from the outer surface thereof. The alignment tabs are disposed in spaced relation to each other along the lateral side of the top section opposite the lateral side including the attachment tabs disposed therealong. Also included on the carrier are two alignment slots which are disposed within respective ones of the side rail sections in aligned relation to respective ones of the alignment tabs.

The attachment tabs are engageable to respective ones of the side rail sections of the carrier of another stackable integrated circuit chip package, with the alignment tabs being releaseably insertable into respective ones of the alignment slots of the carrier of such other stackable integrated circuit chip package. Additionally, the alignment slots are adapted to receive respective ones of the alignment tabs of the carrier of another stackable integrated circuit chip package. In this respect, the engagement of the attachment tabs of the carrier of a lower chip package to the side rail sections of the carrier of an upper chip package stacked upon the lower chip package, and the insertion of the alignment tabs of the carrier of the lower chip package into respective ones of the alignment slots of the carrier of the upper chip package maintains the stacked chip packages in registry along the first and second axes. As a result, the second portion of the conductive pattern of the lower chip package is maintained in registry along the first and second axes with the first portion of the conductive pattern of the upper chip package in the chip stack.

As indicated above, a chip package assembled to include the support member as an alternative to the Z-axis pad may be used a base chip package upon which one or more of the chip packages are stacked in the above-described manner. A chip stack constructed in accordance with the present invention may include any number of chip packages interconnected or mechanically interlocked to each other and to a base chip package.

Further in accordance with the present invention, a chip stack constructed in the above-described manner is preferably used in combination with a cooling system which is placeable into fluid communication with the chip package and operative to circulate cooling air through the top and bottom air paths defined thereby. The cooling system preferably comprises a thermoelectric cooler and a fan which is disposed adjacent the cooler. Fluidly connected to the cooler is one end of a section of flexible hose, the opposite end of which is placed adjacent to the end of the chip stack defined by either of the lateral sides of the top sections of the carriers.

Still further in accordance with the present invention, there is provided a method of assembling a stackable integrated circuit chip package. The method comprises the initial step of wrapping a flexible substrate about at least a portion of a carrier such that a conductive pattern of the flex circuit defines first and second portions. The flex circuit is then secured to the carrier, with an integrated circuit chip then being electrically connected to the first portion of the conductive pattern such that an air path is defined between the integrated circuit chip and the carrier. The method may further comprise the step of releaseably attaching the carrier of a second identically configured stackable integrated circuit chip package to the carrier of the chip package in a manner wherein the integrated circuit chip of the second chip package is electrically connected to the second portion of the conductive pattern of the chip package and the chip packages, when attached to each other, are maintained in registry along first and second axes which are generally co-planar and extend in generally perpendicular relation to each other. The electrical connection of the integrated circuit chip of the second chip package to the second portion of the conductive pattern of the chip package may be accomplished through the use of a Z-axis pad. A further step which may be included in the present method comprises the placement of the stacked chip packages into fluid communication with a cooling unit which is operative to facilitate the flow of cooling air through the air paths thereof.

BRIEF DESCRIPTION OF THE DRAWINGS

These, as well as other features of the present invention, will become more apparent upon reference to the drawings wherein.

DETAILED DESCRIPTION OF THE INVENTION

Figure 1:
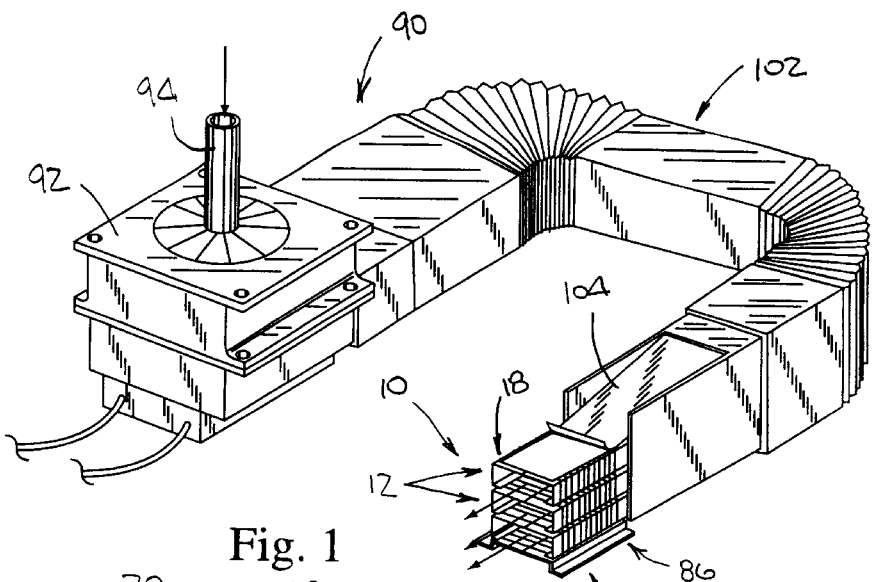
FIG. 1 is a top perspective view of a chip stack assembled using chip packages constructed in accordance with the present invention, further illustrating an active cooling system preferably used in conjunction with the chip stack.
Figure 4:
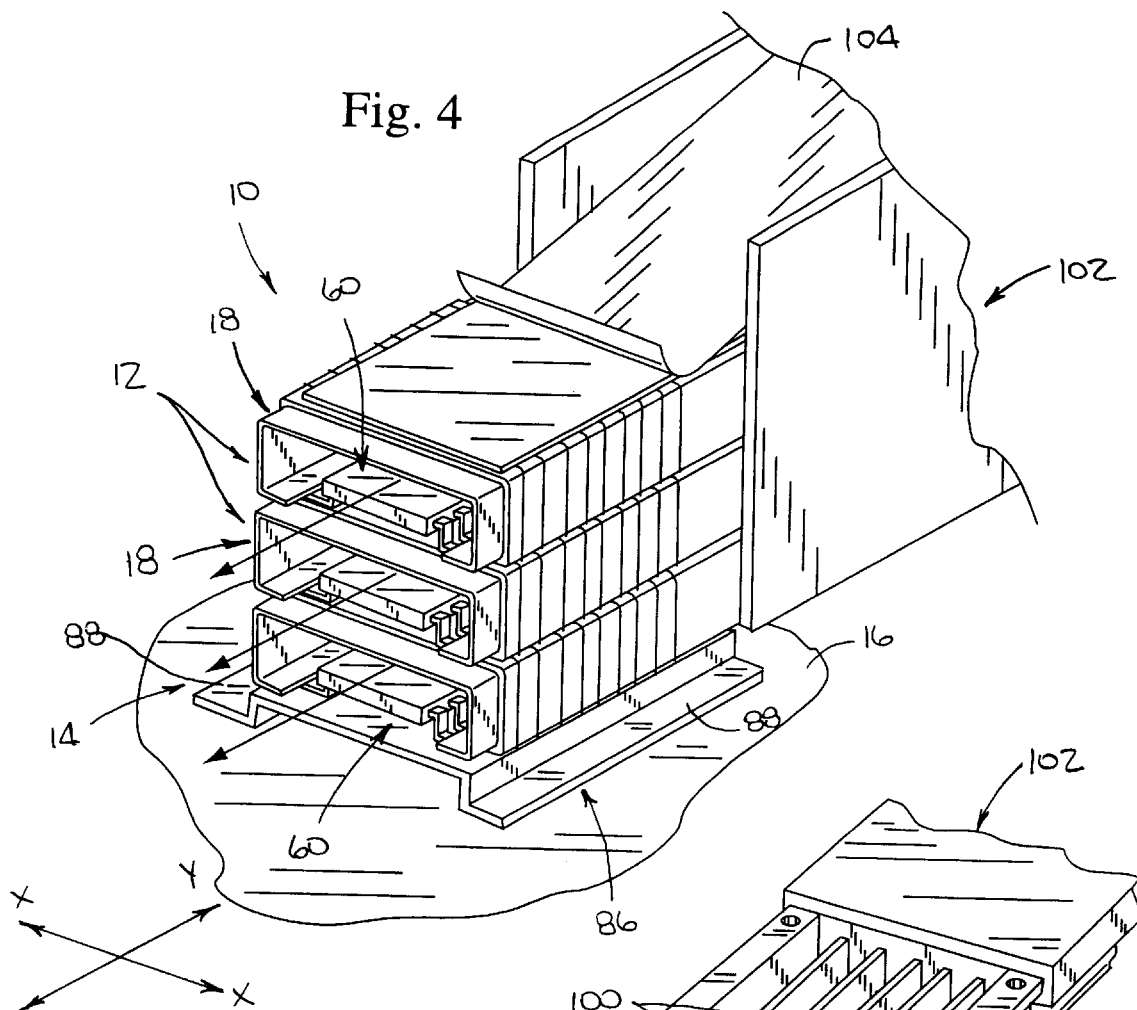
FIG. 4 is an enlargement of a portion of FIG. 1, providing a partial perspective view of the chip stack of the present invention as interfaced to the cooling system.

Referring now to the drawings wherein the showings are for purposes of illustrating a preferred embodiment of present invention only, and not for purposes of limiting the same, FIGS. 1 and 4 perspectively illustrate a chip stack 10 assembled through the use of two identically configured chip packages 12 which are stacked upon and releaseably attached to each other, with one of the chip packages 12 itself being stacked upon and releaseably attached to a base chip package 14. As will be discussed in more detail below, the chip packages 12 are electrically connected to each other, with the lowermost chip package 12 being electrically connected to the base chip package 14. The base chip package 14 is itself mounted (i.e., electrically connected) to a mother board 16. The structural attributes of each chip package 12 and the base chip package 14 within the chip stack 10 will be discussed in detail below. Those of ordinary skill in the art will recognize that the chip stack 10 may be assembled to include fewer or greater than two chip packages 12 as shown in FIGS. 1 and 4.

Figure 2:
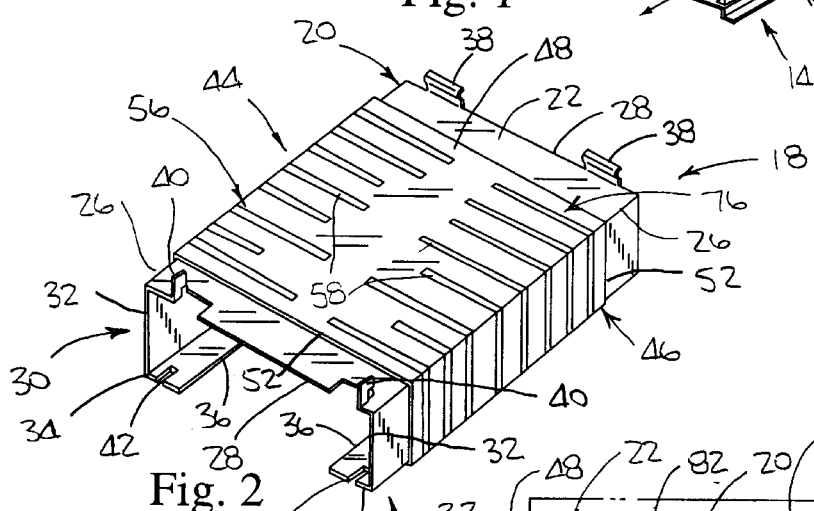
FIG. 2 is a top perspective view of the carrier included in each of the chip packages of the present invention.
Figure 3:
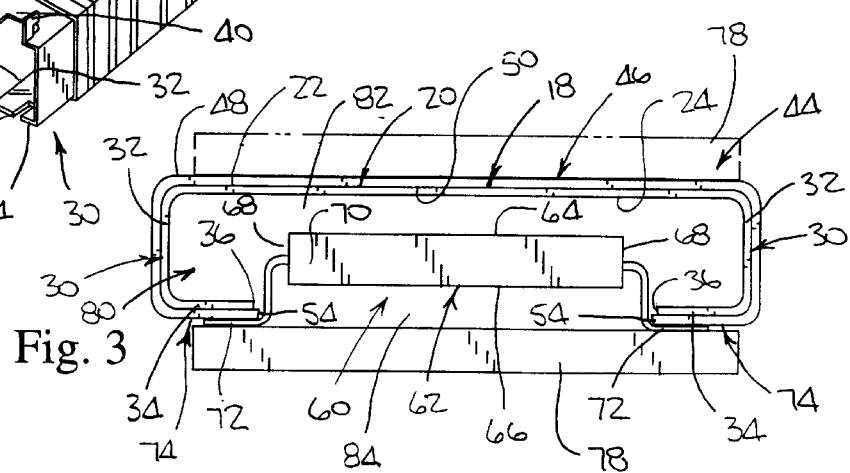
FIG. 3 is a side-elevational view of a chip package of the present invention, illustrating the manner in which another chip package is electrically connected thereto.

Referring now to FIGS. 2 and 3, each chip package 12 comprises a carrier 18 which includes a rectangularly configured top section 20 defining an outer surface 22, an inner surface 24, an opposed pair of longitudinal sides 26, and an opposed pair of lateral sides 28. In addition to the top section 20, the carrier 18 includes an identically configured pair of generally L-shaped side rail sections 30 which are integrally connected to the top section 20 and extend along respective ones of the longitudinal sides 26 thereof. Each of the side rail sections 30 includes a side portion 32 which extends in generally perpendicular relation to the top section 20, and a flange portion 34 which extends laterally inward from the corresponding side portion 32 in spaced, generally parallel relation to the top section 20 (i.e., in generally perpendicular relation to the corresponding side portion 32). Each of the flange portions 34 defines an inner, distal edge 36.

The carrier 18 further comprises two identically configured attachment tabs 38 (i.e., spring clips) which are integrally connected to the top section 20, and protrude or extend upwardly from the top section 20 in generally perpendicular relation to the outer surface 22 thereof. As shown in FIG. 2, the attachment tabs 38 are disposed along one of the lateral sides 28 of the top section 20 in spaced relation to each other. In addition to the attachment tabs 38, the carrier 18 includes an identically configured pair of generally L-shaped alignment tabs 40 which are also integrally connected to the top section 20, and protrude or extend upwardly from the top section 20 in generally perpendicular relation to the outer surface 22 thereof. The alignment tabs 40 are disposed in spaced relation to each other along the lateral side 28 of the top section 20 opposite the lateral side 28 including the attachment tabs 38 disposed therealong. The carrier 18 further includes an identically configured pair of alignment slots 42 which are disposed within respective ones of the flange portions 34 of the side rail sections 30 in registry or alignment with respective ones of the alignment tabs 40. The carrier 18 is preferably formed from a sheet metal material having a preferred wall thickness in the range of from about 0.004 inches to about 0.010 inches. The use of metal to fabricate the carrier 18 provides heat dissipation properties. In the case of sheet metal forming, the same is preferably accomplished by photo-etching the retention features (i.e., attachment tabs 38, alignment tabs 40, alignment slots 42) in the carrier 18.

In addition to the carrier 18, the chip package 12 includes a flex circuit 44. The flex circuit 44 itself comprises a flexible substrate 46 which, prior to being wrapped about the carrier 18 in a manner which will be described in more detail below, has a generally rectangular configuration defining a generally planar top surface 48, a generally planar bottom surface 50, an opposed pair of longitudinal peripheral edge segments 52, and an opposed pair of lateral peripheral edge segments 54. The substrate 46 is preferably fabricated from a polyamide which has a thickness of several mils or less, and may have a thickness down to about 1 mil.

Disposed on the substrate 46, and in particular the top surface 48 thereof, is a conductive pattern 56 of the flex circuit 44. The conductive pattern 56 comprises a plurality of conductive traces 58 which are arranged on the top surface 48 of the substrate in two sets, with the traces 58 of each set extending along the top surface 48 to a respective one of the lateral peripheral edge segments 54 of the substrate 46. The traces 58 are each preferably fabricated from very thin copper having a thickness in the range of from about 5 microns to about 25 microns through the use of conventional etching techniques. The use of thin copper for the traces 58 allows for etching widths and spacings down to a pitch of about 4 mils which substantially increases the routing density on the flex circuit 44.

The chip package 12 further comprises an integrated circuit chip 60 which is preferably a TSOP (thin small outline package) device. In this respect, the integrated circuit chip 60 comprises a rectangularly configured body 62 defining a generally planar top surface 64, a generally planar bottom surface 66, an opposed pair of longitudinal sides 68, and an opposed pair of lateral sides 70. Extending outwardly from each of the longitudinal sides 68 of the body 62 are a multiplicity of generally L-shaped conductive leads 72. The manner in which the integrated circuit chip 60 is electrically connected to the conductive pattern 56 of the substrate 46 will be described below.

In the chip package 12 of the present invention, the substrate 46 is wrapped about and attached to a portion of the carrier 18 such that the conductive pattern 56 defines a lower, first portion 74 and an upper, second portion 76 which extends in spaced, generally parallel relation to the first portion 74. More particularly, the substrate 46 is wrapped about the top and side rail sections 20, 30 of the carrier 18 such that the first portion 74 of the conductive pattern 56 extends over portions of the outer surfaces of the flange portions 34, with the second portion 76 of the conductive pattern 56 extending over a portion of the outer surface 22 of the top section 20. To maintain the substrate 46 in wrapped engagement to the carrier 18, the bottom surface 50 of the substrate 46 is preferably adhesively secured to the outer surface 22 of the top section 20 and to the outer surfaces of the side and flange portions 32, 34 of the side rail sections 30. A preferred adhesive used to facilitate such attachment is an acrylic film adhesive. The substrate 46 is preferably sized relative to the carrier 18 such that once secured thereto in the above-described manner, the lateral peripheral edge segments 54 of the substrate 46 extend to (i.e., are substantially flush with) respective ones of the distal edges 36 defined by the flange portions 34 of the side rail sections 30.

In the chip package 12, the integrated circuit chip 60, and in particular the conductive leads 72 thereof, are electrically connected to the first portion 74 of the conductive pattern 56. It is contemplated that the conductive leads 72 will be electrically connected to respective ones of the traces 58 of each set, with such electrical connection typically being accomplished through the use of solder. The chip package 12 further preferably comprises a Z-axis pad 78 which is itself attached to the conductive leads 72 of the integrated circuit chip 60. The Z-axis pad 78 is used to facilitate the electrical connection of the chip package 12 to the second portion 76 of the conductive pattern 56 of another chip package 12 in a manner which will be described in more detail below. Importantly, as seen in FIG. 3, the carrier 18 and integrated circuit chip 60 are sized and configured relative to each other such that when the conductive leads 72 are electrically connected to the first portion 74 of the conductive pattern 56, an air path 80 is defined between the body 62 of the integrated circuit chip 60 and the remainder of the chip package 12. More particularly, the air path 80 includes an upper section 82 which is defined between the top surface 64 of the body 62 and the inner surface 24 of the top section 20, and a lower section 84 which is defined between the bottom surface 66 of the body 62 and the Z-axis pad 78. The use of the air path 80 will also be discussed in more detail below.

Having thus described the structural attributes of a chip package 12, the preferred method of releaseably attaching or mechanically interlocking the carriers 18 of two chip packages 12 to each other will now be described. More particularly, an upper chip package 12 is oriented relative to a lower chip package 12 such that the alignment tabs 40 of the carrier 18 of the lower chip package 12 are in registry or alignment with respective ones of the alignment slots 42 of the carrier 18 of the upper chip package 12. Thereafter, the upper and lower chip packages 12 are moved toward each other such that the alignment tabs 40 of the lower chip package 12 are advanced into respective ones of the alignment slots 42 of the upper chip package 12. At the same time, the attachment tabs 38 of the carrier 18 of the lower chip package 12 are advanced over respective ones of the flange portions 34 of the side rail sections 30 of the upper chip package 12. Importantly, the attachment tabs 38 of the lower chip package 12 exert a biasing force against the carrier 18 of the upper chip package 12 which causes the flange portions 34 of the side rail sections 30 of the upper chip package 12 to be mechanically interlocked or "snap-fit" to respective ones of the alignment tabs 40 of the lower chip package 12. Such interconnection occurs when the advancement of the alignment tabs 40 of the lower chip package 12 into respective ones of the alignment slots 42 of the upper chip package 12 reaches a point whereat the flange portions 34 of the upper chip package 12 may slide inwardly underneath the laterally or horizontally extending distal segments of the alignment tabs 40 of the lower chip package 12. As will be recognized, the biasing force exerted by the attachment tabs 38 of the lower chip package 12 against the carrier 18 of the upper chip package 12 maintains the flange portions 34 of the side rail sections 30 of the upper chip package 12 in abutting contact against respective ones of the alignment tabs 40 of the lower chip package 12.

When the chip packages 12 are attached to each other in the above-described manner, the Z-axis pad 78 of the upper chip package 12 is in firm, direct contact with the second portion 76 of the conductive pattern 56 of the lower chip package 12. Such contact facilitates the electrical connection of the upper and lower chip packages 12 to each other. In view of its properties, the Z-axis pad 78 is operative to transmit electrical signals from the conductive leads 72 of the integrated circuit chip 60 of the upper chip package 12 to respective ones of the traces 58 of the two sets included in the conductive pattern 56 of the lower chip package 12. Advantageously, the mechanical interlock between the upper and lower chip packages 12 facilitated by the retaining features thereof (i.e., attachment tabs 38, alignment tabs 40, alignment slots 42) maintains the chip packages 12 in registry or alignment along a first axis X and a second axis Y which are generally co-planar and extend in generally perpendicular relation to each other. Such registry ensures the accurate placement of the carriers 18 of the upper and lower chip packages 12 relative to each other such that proper electrical communication is achieved between the conductive leads 72 of the integrated circuit chip 60 of the upper chip package 12 and the traces 58 of the second portion 76 of the conductive pattern 56 of the lower chip package 12.

As indicated above, the chip stack 10, in addition to including one or more chip packages 12, also includes the base chip package 14. The base chip package 14 is virtually identical in structure to the above-described chip package 12. In this respect, the base chip package 14 differs from the chip package 12 only in that the Z-axis pad 78 is replaced by a support member 86 which is electrically connected to the conductive leads 72 of the integrated circuit chip 60 of the base chip package 14.

The support member 86 includes a pair of flange portions 88 which extend laterally outward from the remainder thereof and are used to facilitate the mounting or electrical connection of the base chip package 14 to the mother board 16. Though not shown, it is contemplated that the support member 86 will be provided with conductive pads and/or traces which facilitate the electrical connection of the first portion 74 of the conductive pattern 56 of the base chip package 14 to conductive pads or contacts on the mother board 16, thus placing the entirety of the chip stack 10 into electrical communication therewith. As will be recognized, the releaseable attachment of a chip package 12 to the base chip package 14 occurs in the same manner previously described in relation to the attachment of two chip packages 12 to each other. The attachment of one or more chip packages 12 to the base chip package 14 facilitates the formation of the chip stack 10. For purposes of clarity, the integrated circuit chips 60 are not shown in the chip packages 12 and base chip package 14 of the chip stack 10 shown in FIG. 1, nor are the retention features (attachment tabs 38, alignment tabs 40, alignment slots 42) shown in the chip package 12 in FIG. 3 or the chip packages 12 and base chip package 14 of the chip stack 10 shown in FIG. 4.

Figure 5:
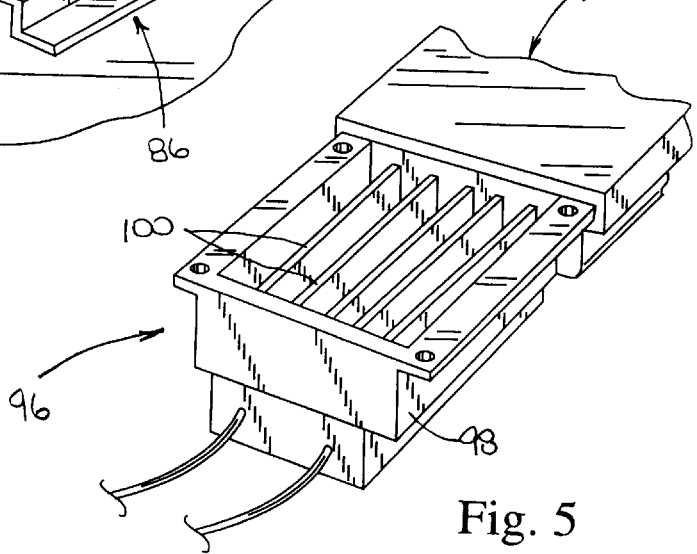
FIG. 5 is a partial perspective view of a cooling unit which may be included in the cooling system shown in FIG. 1.

Referring now to FIGS. 1, 4 and 5, the chip stack 10 constructed in accordance with the present invention is specifically adapted to be used in conjunction with an active cooling system 90. Such cooling system 90 preferably comprises a fan 92 which includes an air intake 94. Attached to the fan 92 is a thermo-electric cooler 96 (shown in FIG. 5) comprising a chassis 98 having a plurality of heat dissipating fins 100 disposed therein in spaced relation to each other. As is known in the art, the thermo-electric cooler 96, when activated, functions as a heat exchanger which effectively cools air circulated over the fins 100 thereof.

In the cooling system 90, one end of a molded duct or flex hose 102 is fluidly connected to the thermo-electric cooler 96. As best seen in FIG. 4, the opposite end of the flex hose 102 is operatively coupled to the chip stack 10 through the use of a spring-loaded cover 104. More particularly, the flex hose 102 is engaged to an end of the chip stack 10 defined by corresponding lateral sides 28 of the top sections 20 of the carriers 18 thereof.

As is further shown in FIG. 4, the activation of the fan 92 draws air into the air intake 94 and facilitates the circulation of such air over the fins 100 of the thermoelectric cooler 96 and into the flex hose 102. As indicated above, the thermo-electric cooler 96 effectively cools such air which is forced by the fan 92 through the flex hose 102 and through the air paths 80 of the carriers 18 of the chip stack 10. Importantly, the circulation of cooling air through the chip packages 12 and base chip package 14 of the chip stack 10, and in particular the upper and lower sections 82, 84 of the air paths 80 thereof, effectively cools the integrated circuit chips 60 within the chip stack 10. Through the use of the cooling system 90, the temperature of the cooling air can be below internal or external ambient temperature. The active cooling system 90 which uses a cold source below ambient temperature does not require a fluid to a fluid heat exchanger. Additionally, the fluid ducting system or flex hose 102 is adaptable to a fixed or varied number of chip packages 12 within the chip stack 10, with the ducting system or flex hose 102 also allowing the location of the chip stack 10 to be independent of the location of the air intake 94 and thermoelectric cooler 96. Even though the cooling system 90 requires volume inside the system, the space requirements on the mother board 16 are still minimized by the use of the high density, high duty cycle chip stack 10.

Additional modifications and improvements of the present invention may also be apparent to those of ordinary skill in the art. For example, in each chip package 12, the Z-axis pad 78 may be attached to the second portion 76 of the conductive pattern 56, rather than being attached to the conductive leads 72 of the integrated circuit chip 60, with the second portion 76 of the conductive pattern 56 of the base chip package 14 also including a Z-axis pad 78 pre-attached thereto to achieve electrical connection with the conductive leads 72 of the integrated circuit chip 60 of the chip package 12 releaseably attached thereto. Thus, the particular combination of parts and steps described and illustrated herein is intended to represent only certain embodiments of the present invention, and is not intended to serve as limitations of alternative devices within the spirit and scope of the invention.

What is claimed is:

1. A stackable integrated circuit chip package, comprising:
   a carrier;
   a flex circuit comprising:
      a flexible substrate having opposed top and bottom surfaces; and
      a conductive pattern disposed on the substrate;
      the substrate being wrapped about and attached to at least a portion of the carrier such that the conductive pattern defines first and second portions;
   an integrated circuit chip electrically connected to the first portion of the conductive pattern such that an air path is defined between the integrated circuit chip and the carrier;
   the chip package being configured such that the second portion of the conductive pattern and the integrated circuit chip are each electrically connectable to another stackable integrated circuit chip package.

2. The chip package of claim 1 wherein the carrier is sized and configured to be releaseably attachable to the carrier of at least other identically configured stackable integrated circuit chip package in a manner wherein the chip packages, when attached to each other, are maintained in registry along first and second axes which are generally co-planar and extend in generally perpendicular relation to each other.

3. The chip package of claim 2 wherein:
   the carrier includes at least one alignment tab protruding therefrom and at least one alignment slot disposed therein;
   the alignment tab being removably insertable into the alignment slot of the carrier of another stackable integrated circuit package and the alignment slot being adapted to receive the alignment tab of another stackable integrated circuit chip package to maintain the chip packages in registry along the first and second axes when the chip packages are attached to each other.

4. The chip package of claim 3 wherein:
   the carrier further includes at least one attachment tab protruding therefrom which is mechanically interlockable to the carrier of another stackable integrated circuit chip package.

5. The chip package of claim 4 wherein:
   the carrier has a generally rectangular top section which defines inner and outer surfaces and opposed pairs of longitudinal and lateral sides, and a pair of side rail sections which extend along respective ones of the longitudinal sides of the top section and each define an outer surface and a distal edge;
   the bottom surface of the substrate is attached to portions of the outer surfaces of the top section and the side rail sections; and
   the substrate is wrapped about and attached to the carrier such that the first portion of the conductive pattern extends over portions of the outer surfaces of the side rail sections, and the second portion of the conductive pattern extends over a portion of the outer surface of the top section in spaced, generally parallel relation to the first portion.

6. The chip package of claim 5 wherein:
   two attachment tabs are integrally connected to the top section and protrude upwardly from the outer surface thereof, the attachment tabs being disposed along one of the lateral sides of the top section in spaced relation to each other;
   two alignment tabs are integrally connected to the top section and protrude upwardly from the outer surface thereof, the alignment tabs being disposed in spaced relation to each other along the lateral side of the top section opposite the lateral side including the attachment tabs disposed therealong; and
   two alignment slots are disposed within respective ones of the side rail sections in aligned relation to respective ones of the alignment tabs;
   the attachment tabs being mechanically interlockable to respective ones of the side rail sections of the carrier of another stackable integrated circuit chip package, the alignment tabs being releaseably insertable into respective ones of the alignment slots of the carrier of another stackable integrated circuit chip package, and the alignment slots being adapted to receive respective ones of the alignment tabs of the carrier of another stackable integrated circuit chip package.

7. The chip package of claim 6 wherein:
   the substrate has a generally rectangular configuration defining opposed pairs of longitudinal and lateral peripheral edge segments;
   the conductive pattern extends along the top surface of the substrate to the lateral peripheral edge segments thereof; and
   the substrate is sized relative to the carrier such that when the substrate is wrapped about portions of the outer surfaces of the top and side rail sections, the lateral peripheral edge segments of the substrate extend to approximately respective ones of the distal edges of the side rail sections.

8. The chip package of claim 5 wherein the ntegrated circuit chip comprises:
   a body having opposed, generally planar top and bottom surfaces, an opposed pair of longitudinal sides, and an opposed pair of lateral sides; and
   a plurality of conductive leads extending from each of the longitudinal sides of the body;
   the conductive leads of the integrated circuit chip being electrically connected to the first portion of the conductive pattern.

9. The chip package of claim 8 wherein the integrated circuit chip is a TSOP device.

10. The chip package of claim 8 further comprising a Z-axis pad electrically connected to the conductive leads of the integrated circuit chip for facilitating the electrical connection of the chip package to the second portion of the conductive pattern of another stackable integrated circuit chip package.

11. The chip package of claim 10 wherein the conductive leads of the integrated circuit chip are sized and configured such that a top air path is defined between the top surface of the body and the inner surface of the top section, and a bottom air path is defined between the bottom surface of the body and the Z-axis pad.

12. The chip package of claim 8 further comprising a support member electrically connected to the conductive leads of the integrated circuit chip for facilitating the electrical connection of the chip package to a mother board.

13. The chip package of claim 1 wherein the substrate is attached to the carrier through the use of an acrylic film adhesive.

14. The chip package of claim 1 wherein the substrate is fabricated from a polyamide having a thickness in the range of from about 1 mil to about 8 mils.

15. The chip package of claim 1 wherein the carrier is fabricated from a sheet metal material.

16. The chip package of claim 1 further in combination with a cooling system placeable into fluid communication with the chip package and operative to circulate cooling air through the air path.

17. The chip package of claim 16 wherein the cooling system comprises:
   a thermoelectric cooler; and
   a fan disposed adjacent the cooler.

18. The chip package of claim 5 further in combination with a second chip package stacked upon and releaseably attached to the chip package, the mechanical interlock of the attachment tabs of the chip package to respective ones of the side rail sections of the second chip package and the receipt of the alignment tabs of the chip package into respective ones of the alignment slots of the second chip package maintaining the second portion of the conductive pattern of the chip package in registry with the first portion of the conductive pattern of the second chip package.

19. A method of assembling a stackable integrated circuit chip package, comprising the steps of:
   (a) wrapping a flexible substrate about at least a portion of a carrier such that a conductive pattern of the flex circuit defines first and second portions;
   (b) securing the flex circuit to the carrier; and
   (c) electrically connecting an integrated circuit chip to the first portion of the conductive pattern such that an air path is defined between the integrated circuit chip and the carrier.

20. The method of claim 19 further comprising the step of:
   (d) releaseably attaching the carrier of a second identically configured stackable integrated circuit chip package to the carrier of the chip package in a manner wherein the integrated circuit chip of the second chip package is electrically connected to the second portion of the conductive pattern of the chip package, and the chip packages, when attached to each other, are maintained in registry along first and second axes which are generally co-planar and extend in generally perpendicular relation to each other.

21. The method of claim 20 wherein the electrical connection of the integrated circuit chip of the second chip package to the second portion of the conductive pattern of the chip package in step (d) is accomplished through the use of a Z-axis pad.

22. The method of claim 20 further comprising the step of:
   (e) placing the stacked chip packages into fluid communication with a cooling unit which is operative to facilitate the flow of cooling air through the air paths thereof.

* * * * *